United States Patent
Massin et al.

(10) Patent No.: US 7,463,033 B2
(45) Date of Patent: Dec. 9, 2008

(54) NMR PROBE COMPONENT WITH A GRADIENT CHIP WITH A SLOT FOR INSERTION OF A SAMPLE CHIP

(75) Inventors: Charles Massin, Grandson (CH); Michael Fey, Hornussen (CH); Schimun Denoth, Zurich (CH); Frank Vincent, Sévery (CH)

(73) Assignee: Bruker Biospin AG, Faellanden (CH)

( * ) Notice: Subject to any disclaimer, the term of this patent is extended or adjusted under 35 U.S.C. 154(b) by 0 days.

(21) Appl. No.: 11/892,316

(22) Filed: Aug. 22, 2007

(65) Prior Publication Data

US 2008/0068018 A1 Mar. 20, 2008

(30) Foreign Application Priority Data

Aug. 31, 2006 (EP) .................................. 06018192

(51) Int. Cl.
*G01V 3/00* (2006.01)
(52) U.S. Cl. ..................................... 324/321; 324/300
(58) Field of Classification Search ......... 324/300–322; 600/407–449
See application file for complete search history.

(56) References Cited

U.S. PATENT DOCUMENTS

| | | | |
|---|---|---|---|
| 5,416,414 A | 5/1995 | Mansfield | |
| 5,952,831 A | 9/1999 | Yamakoshi | |
| 6,798,200 B2 | 9/2004 | Fan | |
| 6,936,224 B2* | 8/2005 | Fichera et al. | 422/63 |
| 7,019,526 B2* | 3/2006 | Lukens et al. | 324/321 |
| 7,274,191 B2* | 9/2007 | Park et al. | 324/318 |
| 7,403,008 B2* | 7/2008 | Blank et al. | 324/316 |

OTHER PUBLICATIONS

Peck T.L. et al: "RF microcoils patterned using microlithographic techniques for use as microsensors in NMR", Engineering in Medicine and Biology Society, 1993. Proceedings of the 15th Annual International Converence of the IEEE Oct. 28-31, 1993, Piscataway, NJ, USA Oct. 28, 1993, pp. 174-175.

(Continued)

*Primary Examiner*—Brij B Shrivastav
(74) *Attorney, Agent, or Firm*—Paul Vincent (57) ABSTRACT

A nuclear magnetic resonance (NMR) probe component, comprising a microfabricated planar gradient chip (1), with a substrate thickness $d_{gc} \leq 3$ mm, carrying three micromachined planar partial gradient coils (10a-10f) on each of its two outer surfaces (12a, 13a), wherein the partial gradient coils (10a-10f) of the gradient chip (1) form a three-dimensional gradient system, wherein the gradient chip (1) has a central guiding and positioning slot (15) between the two outer surfaces (12a, 13a). The probe component also has a sample chip (2) for carrying an NMR sample at a sample location, with a microfabricated planar RF coil (21), wherein the sample chip (2) fits exactly in the guiding and positioning slot (15) such that in a measurement position, the sample location coincides with the center of the gradient system. The NMR probe component has improved spatial resolution and allows good alignment of the RF coil and the gradient system.

14 Claims, 9 Drawing Sheets

OTHER PUBLICATIONS

Goloshevsky A.G. et al: "Integration of biaxial planar gradient coils and an RF microcoil for NMR flow imaging", Measurement Science and Technology, Institute of Physics Publishing, Bristol, GB, vol. 16, No. 2, Feb. 1, 2005, pp. 505-512.

Seeber D.A. et al: "Triaxial magnetic field gradient system for microcoil magnetic resonance imaging", Review of Scientific Instruments, American Institute of Physics, US, vol. 71, No. 11, Nov. 2000, pp. 4263-4272.

Massin C et al: "Planar micocoil-based magnetic resonance imaging of cells", Transducers, Solid-State Sensors, Actuators and Microsystems, 12th Innational Conference on, 2003, Piscataway, NJ, USA, IEEE, vol. 2, Jun. 9, 2003, pp. 967-970.

"Surface microcoils for MR imaging" Bruker BioSpin AG, Faellanden, Switzerland, 2006.

* cited by examiner

NMR PROBE COMPONENT WITH A GRADIENT CHIP WITH A SLOT FOR INSERTION OF A SAMPLE CHIP

This application claims Paris Convention priority of EP 06 018 192.2 filed Aug. 31, 2006 the complete disclosure of which is hereby incorporated by reference.

BACKGROUND OF THE INVENTION

The invention relates to an NMR probe component for small samples.

Such an NMR probe component is known from U.S. Pat. No. 5,416,414.

Nuclear magnetic resonance imaging is a non-destructive method of imaging of the volume of samples. Microcoil magnetic resonance imaging (see e.g. D. A. Seeber et al, Rev. Sci. instrum. Vol. 71, No. 11, 4263-4272, (2000)) is used to investigate small samples with spatial dimensions of about 100 µm, e.g, biological tissue samples.

In NMR imaging, the sample is positioned in a strong static magnetic field, and subjected to radio frequency (RF) pulses. The RF signal produced by the excited sample is then recorded. In order to allow spatial encoding, the static magnetic field is superimposed with a gradient field. In order to achieve good spatial resolution, high magnetic field gradients are necessary at the sample location.

From the flyer "Surface microcoils for MR imaging" of Bruker Biospin AG, Fällanden, Switzerland, 2006, it is known to provide a sample well together with an RF microcoil on a glass chip. The glass chip is mounted on an exchangeable insert of an NMR probe.

From U.S. Pat. No. 5,416,414 it is known to put a sample between two cover slips of a slide, wherein the slide has an integrated RF coil. The slide is put into a plastic holder, which is part of an NMR probe and placed in an NMR apparatus comprising a gradient coil system.

This latter NMR probe component concept is disadvantageous in that the achievable spatial resolution at imaging is insufficient for some sample types. Moreover, the alignment of the RF coil with the gradient field may be imprecise.

It is the object of the invention to introduce an NMR probe component, in particular for NMR imaging of small samples, that allows one to perform imaging at an improved spatial resolution and which allows good alignment of the RF coil and the gradient system.

SUMMARY OF THE INVENTION

This object is achieved, in accordance with the invention, by a nuclear magnetic resonance (NMR) probe component, comprising a microfabricated planar gradient chip, with a substrate thickness $d_{gc} \leq 3$ mm, carrying three micromachined planar partial gradient coils on each of its two outer surfaces, wherein the partial gradient coils of the gradient chip form a three-dimensional gradient system, wherein the gradient chip has a central guiding and positioning slot between the two outer surfaces, and a sample chip for carrying an NMR sample at a sample location, with a microfabricated planar RF coil, wherein the sample chip fits exactly in the guiding and positioning slot such that in a measurement position, the sample location coincides with the center of the gradient system.

The basic idea of the invention is to provide a gradient chip, into which a sample chip may be inserted easily and with great accuracy. The gradient chip carries a gradient coil system. With the sample chip positioned in the gradient chip, the gradient system is always well aligned with the respect to the RF coil which is located on the sample chip. Further, the gradient system is very compact and close to the sample location on the sample chip, what allows very high gradient strengths (typically >10 T/m) at the sample location, and therefore superior spatial resolution. A typical sample chip thickness $d_{sc}$ is 1 mm or less. The sample may be changed very easily by exchanging the sample chip carrying the sample at the sample location. The gradient chip and the sample chip can be produced by accurate photolithographic processes.

In a preferred embodiment of the inventive NMR probe component, the gradient chip consists at least partially of a material with a thermal conductivity $\geq 75$ W/(mK), in particular wherein the gradient chip consists at least partially of silicon. Preferably, at least half of the gradient chip consists of a material with thermal conductivity $\geq 75$ W/(mK). This minimizes heating of the sample and gradient holder by absorbing the heat produced by resistive losses in the gradient coil conductors.

Further preferred is an embodiment wherein the gradient chip comprises two outer substrates, in particular of silicon, and an intermediate substrate, in particular of glass. This design simplifies the manufacturing of the gradient chip, and in particular the manufacturing of the central guiding and positioning slot. The intermediate substrate is preferably of a material different from the material of the outer substrates in order to facilitate bonding between the substrates. However, if adequate bonding between substrates of identical material (such as silicon on silicon) is feasible, the gradient chip may be made of two outer substrates only.

A preferred embodiment provides that the slot comprises two opposing guide grooves, abutting the sample chip at three side faces if the sample chip is within the slot, and that the slot further comprises a sample groove, facing the sample location of the sample chip and surrounding the sample chip if the sample chip is within the slot. This simple design guarantees good positioning accuracy and easy handling.

In an advantageous further development of this embodiment, the slot is substantially T-shaped in a cross-section perpendicular to the direction of insertion of the sample chip. The side parts of the T-shaped slot can be used to guide the sample chip, and the central part of the T-shaped slot is well-suited to house the sample location resp. the sample, e.g. a sample well. The T-shape is particularly simple to manufacture.

In a particularly preferred embodiment, the gradient system is adapted to produce a magnetic field gradient $\geq 10$ T/m, in particular $\geq 50$ T/m. Due to the small distance between the two outer surfaces of the gradient chip carrying the partial gradient coils, which is about 3 mm or less, such high gradient strengths are easily available. The high gradient strength allows a superior spatial resolution in NMR imaging of the sample. Note that this embodiment typically also provides that the gradient system is adapted to carry high gradient currents of 10 A or more, or even 50 A or more.

Further preferred is an embodiment, wherein the sample chip comprises coupling means for inductive or capacitive coupling to a probe. Then electrical contacts such as wires are not needed, simplifying the change of the sample chip.

In a further development of this embodiment, the coupling means comprises a micromachined planar coupling coil separated from the RF coil. This is a simple realization of coupling, proven in practice. Typically, the coupling coil area is larger than the RF coil area (i.e. the coupling coil is larger than the RF coil).

A further preferred embodiment of the inventive NMR probe component is characterized in that the outer surfaces of the gradient chip have etched grooves receiving part of the gradient coils, wherein conducting sections of the gradient coils have been deposited within the etched grooves. By this means, thermal heat produced by resistive losses in the gradient coil wires is removed very efficiently.

In another advantageous embodiment, the sample chip comprises a sample well. The sample well is well suited for housing liquid samples.

Also within the scope of the present invention is an NMR spectrometer, with an automated sample chip handling system, feeding sample chips to a probe head of the NMR spectrometer, comprising an inventive NMR probe component as described above. The gradient chip with the slot allows accurate positioning of the sample chip, in particular when automatically placing the sample chip. So by means of the invention, automated sample investigation can be improved, in particular towards better spatial resolution.

In a preferred embodiment of the inventive NMR spectrometer, the sample chip handling system comprises pneumatic transport means for moving the sample chips based on pressurized gas, in particular air or N2 or a noble gas. This is a gentle way to transport the sample chips. Note that when handling the sample chips with pressurized gas, gas channels may be provided within the gradient chip.

In another highly preferred embodiment, the NMR spectrometer is adapted for magnetic resonance imaging (MRI) of samples ≦1 mm. Then the accuracy and high spatial resolution achievable with the invention are particularly useful.

Further advantages can be extracted from the description and the enclosed drawing. The features mentioned above and below can be used in accordance with the invention either individually or collectively in any combination. The embodiments mentioned are not to be understood as exhaustive enumeration but rather have exemplary character for the description of the invention.

The invention is shown in the drawing.

DESCRIPTION OF THE PREFERRED EMBODIMENT

Figure 1:
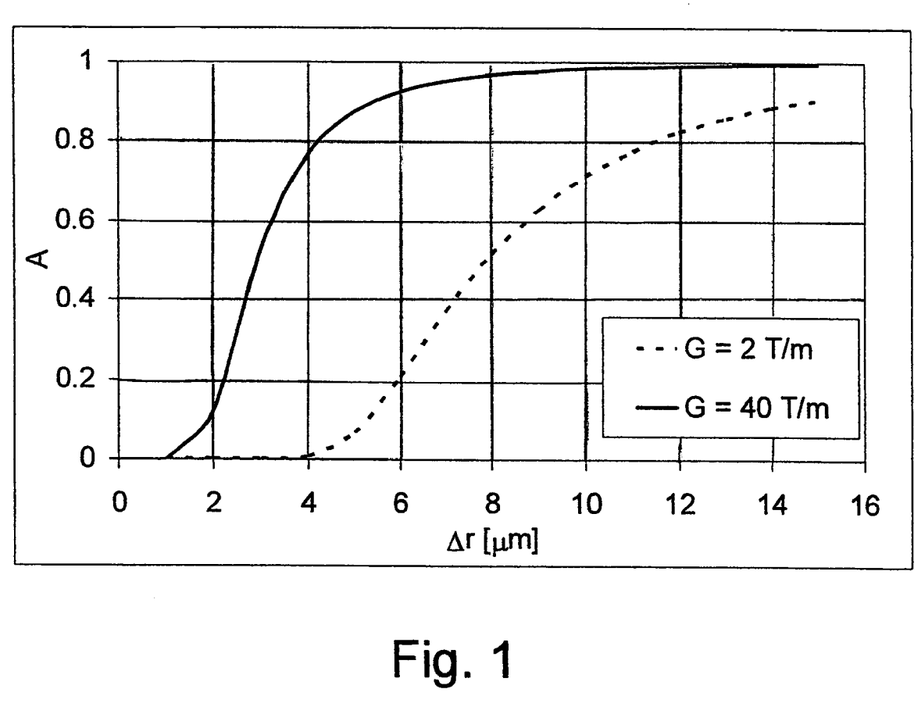
FIG. 1 shows a diagram illustrating the NMR signal attenuation due to diffusion as a function of spatial resolution for two gradient strengths.

FIG. 1 illustrates in a diagram the NMR signal attenuation due to diffusion. The attenuation factor A shown is calculated for a pure water sample and a frequency-encoding method, and plotted as a function of the spatial resolution Δr, for a gradient strength of 2 T/m (commercially available) and 40 T/m, respectively. Note that with the commercially available gradient strength of 2 T/m, the signal becomes strongly attenuated for resolutions below 5 µm. It can be concluded that in order to achieve a spatial resolution on the order of 3 µm, a gradient strength of at least 10 T/m is required.

Figure 2:
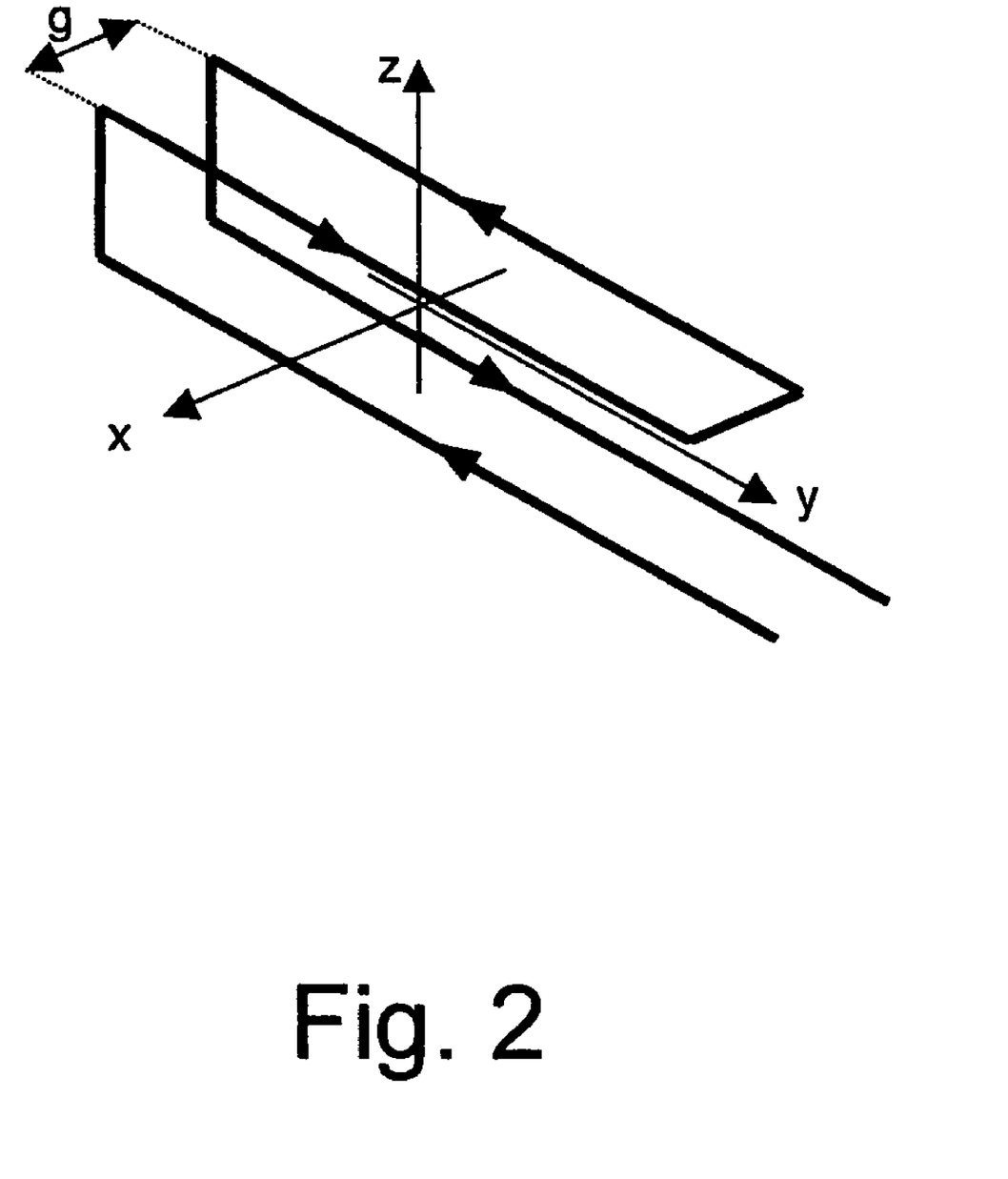
FIG. 2 shows a schematic perspective view of a gradient coil arrangement for generating a z gradient, with two partial coils at a distance g.

FIG. 2 shows a typical coil arrangement for producing a linear magnetic field gradient along the z direction known from the state of the art, but suitable for use with the present invention, too. In order to produce a high gradient strength, the distance g between the partial coils must be low (see FIG. 3).

Figure 3:
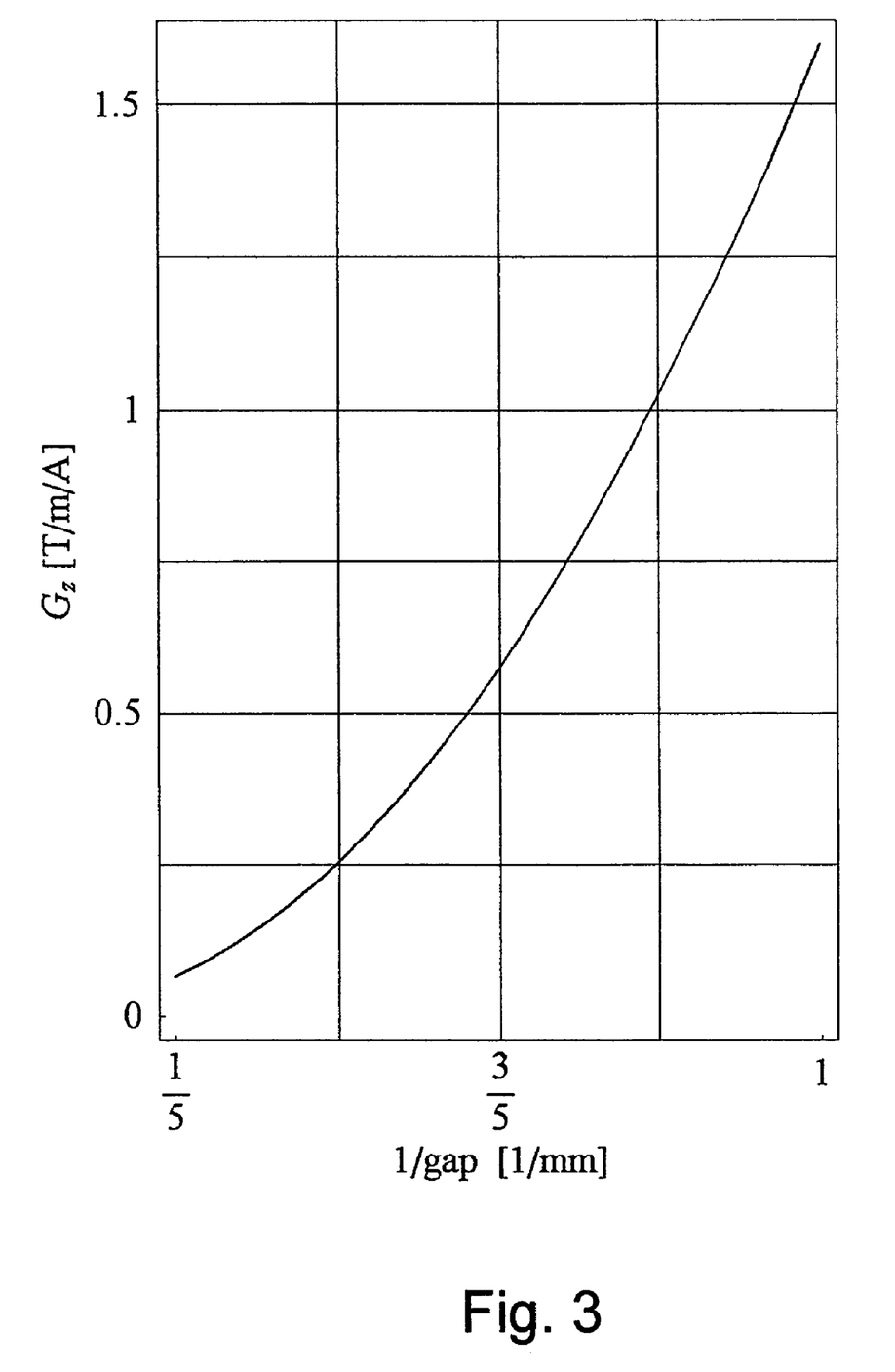
FIG. 3 shows a diagram illustrating the gradient strength as a function of the inverse distance 1/g of partial z gradient coils in a coil arrangement as shown in FIG. 2.

In FIG. 3, the z gradient strength $G_z$ as a function of the inverse of the partial gradient coil distance (or gap) 1/g (compare FIG. 2) is illustrated.

Assuming a maximum current of about 60 A within the gradient coil arrangement of FIG. 2, one can find that in order to achieve a gradient strength larger than 10 T/m, the distance or gap g between the partial coils must be 3 mm or less.

Figure 4:
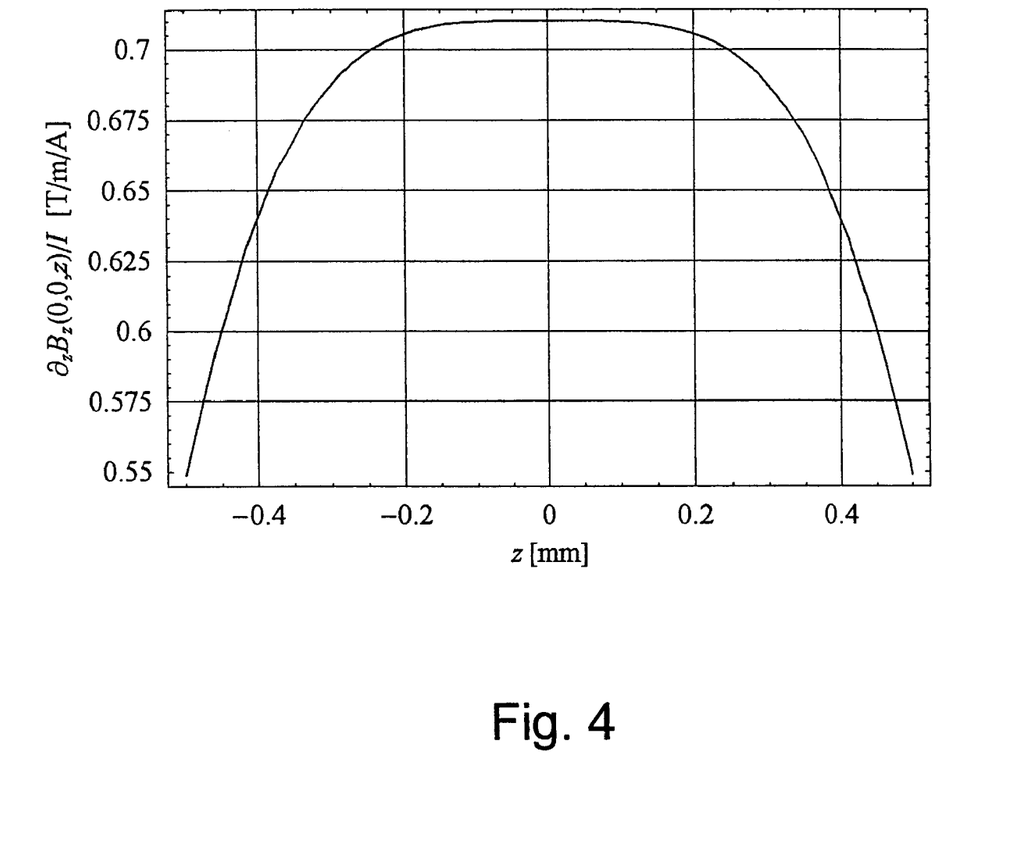
FIG. 4 shows a diagram illustrating the z gradient field profile of a coil arrangement as shown in FIG. 2 with a gap g of 1.5 mm.

FIG. 4 shows the z gradient strength $\partial_z B_z$ as a function of location in direction z for the coil arrangement of FIG. 2, with a gap of 1.5 mm. The arrangement produces a gradient strength of 0.71 T/m/A relatively constant over a distance of +/−0.2 mm from the center. Assuming a maximum current of about 60 A, the gradient strength would be as high 42 T/A.

Figure 5:
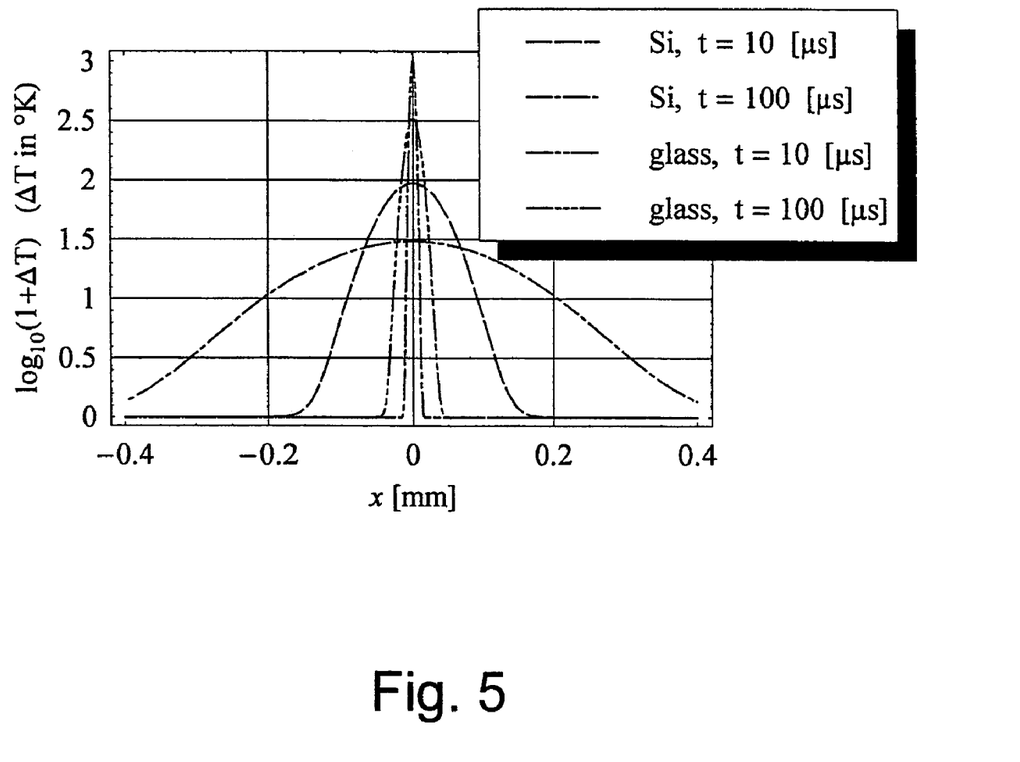
FIG. 5 illustrates the temperature distribution of a substrate having been subjected to a local heating, at different times after the heating, as a function of the distance from the location of the heating.

FIG. 5 illustrates the temperature rise for different substrate materials, namely silicon and glass, after a heat explosion produced by an electric current running through the gradient coil wire, for a typical gradient pulse. For each substrate, two points of time are illustrated (10 µs and 100 µs after the heating). In silicon, which as a much better thermal conductivity than glass, the heat is absorbed much faster than in glass, so the maximum temperature is largely reduced (note the logarithmic scale).

Figure 6:
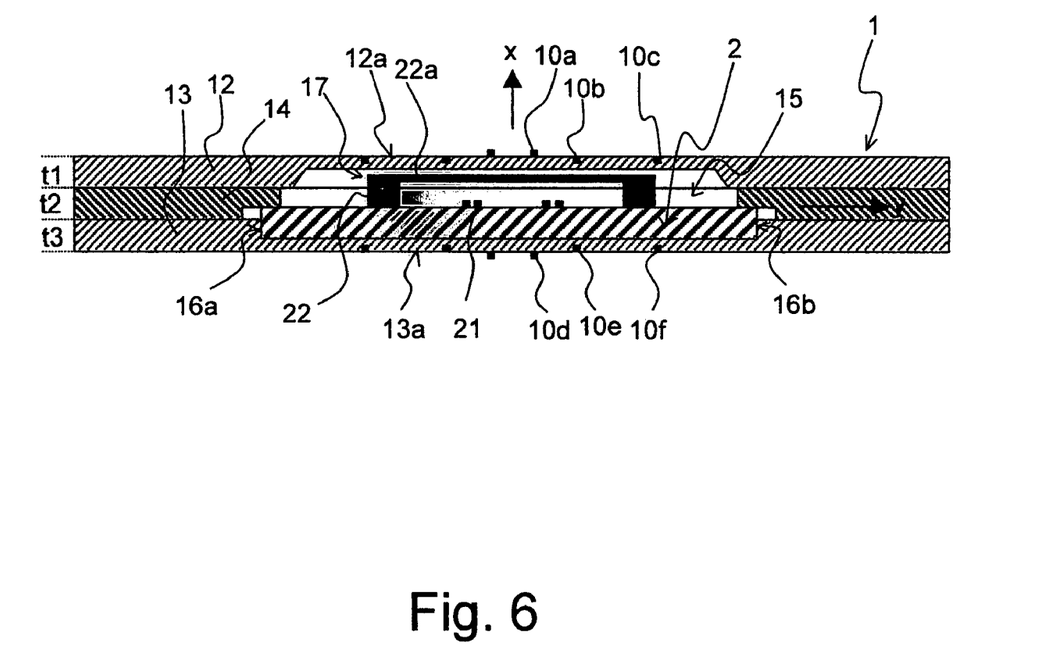
FIG. 6 shows a schematic cross sectional view of an inventive NMR probe component, with a sample chip inserted in a measurement position.

FIG. 6 shows a schematic cross-sectional view of an inventive NMR probe component. The cross-sectional view is taken in the direction of insertion of a sample chip 2 into a gradient chip 1, with the sample chip 2 in measurement position.

The microfabricated planar gradient chip 1 comprises a top outer substrate 12 made of silicon, a bottom outer substrate 13 also made of silicon, and an intermediate substrate 14 made of Pyrex glass. Each substrate 12, 13, 14 has a thickness t1, t2, t3 of about 0.5 mm, resulting in a thickness $d_{gc}$ of the gradient chip in x direction of about 1.5 mm. The outer surface 12a of the upper outer substrate 12 carries a set of three micromachined planar partial gradient coils 10a, 10b, 10c; note that only a few symmetrical wires of them are visible in the cross-section of FIG. 6. Also, the outer surface 13a of the bottom outer substrate 13 carries a set of three micromachined planar partial gradient coils 10d, 10e, 10f. All partial gradient coils 10a-10f together form a three dimensional orthogonal gradient system (directions x, y are shown in FIG. 6, and the z direction is perpendicular to the plane of drawing of FIG. 6).

Within the gradient chip 1, there is a central guiding and positioning slot 15. Within the slot 15, the sample chip 2 is placed. The sample chip 2 comprises a substrate made of Pyrex glass. The side parts of the sample chip 2 are closely guided within the slot 15 by two opposing guiding grooves 16a, 16b from three sides (top side, bottom) in cross-section, giving the sample chip 2 a secure and accurate fixing. In more detail, the width of sample chip 2 in y direction in the area of its substrate corresponds to the width of the slot 15 in y direction in the area of the guide grooves 16a, 16b. The height in x direction of the sample chip 2 in the area of its substrate corresponds to the height of the slot 15 in x direction in the area of the guide grooves 16a, 16b.

The slot 15 further comprises a sample groove 17, which gives space for a sample as follows: On the upper side of the sample chip 2, there is a sample well 22, covered by a cover slip 22a. The interior of the sample well 22 defines a sample location, and within the sample well 22, there is a liquid sample (not visible in FIG. 6). Thus, the sample groove 17 surrounds the sample well 22 and thus the sample, leaving some space between the sample well 22 and the walls of the slot 15 in order to avoid a damaging of the sample upon insertion.

Within the sample well 22, and located on the surface of the sample chip 2, there is a microfabricated planar RF coil 21. The RF coil 21—and thus the location from where information is collected during NMR imaging—is in the center of the gradient system formed by the gradient coils 10a-10f.

Figure 7:
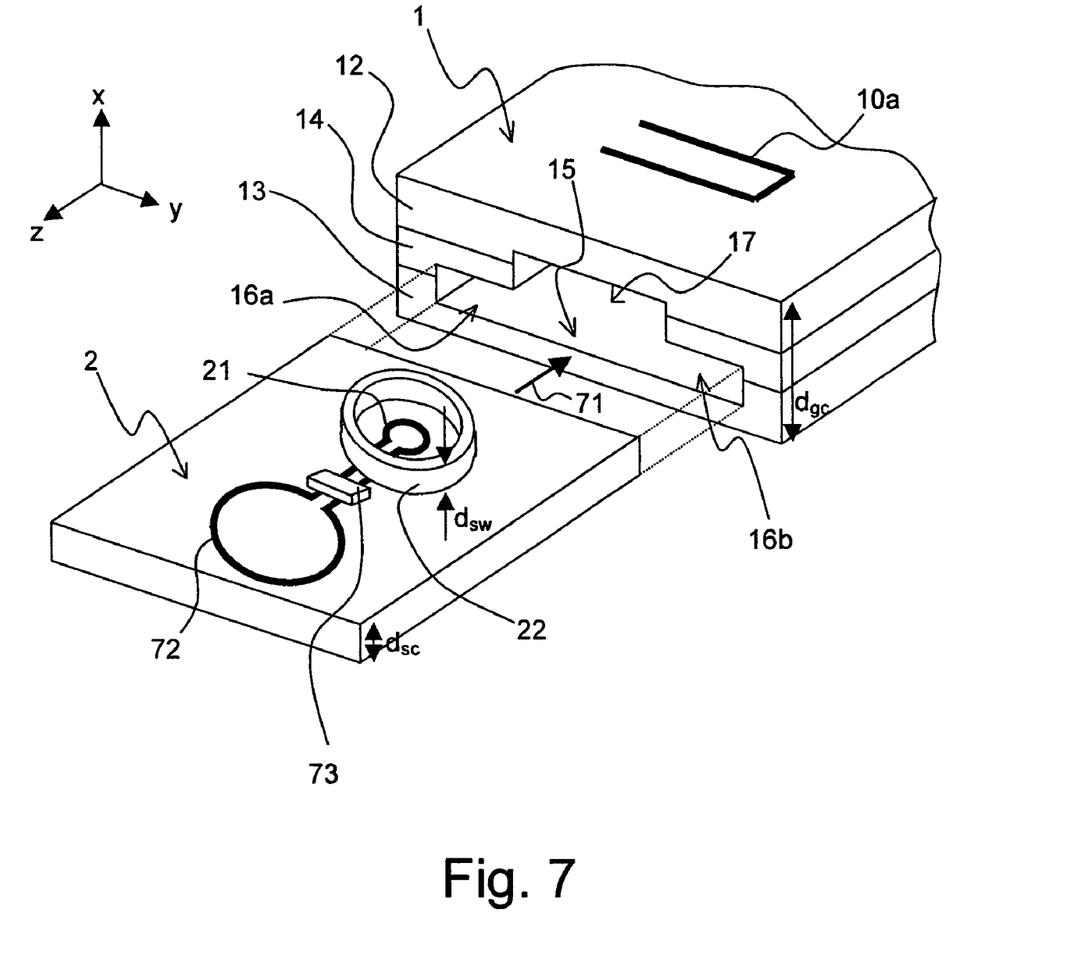
FIG. 7 shows a schematic perspective view of another inventive NMR probe component, with a sample chip ready for insertion located before a gradient chip.

FIG. 7 shows schematically another inventive NMR probe component, with a gradient chip 1 and a sample chip 2 before insertion in direction 71.

The gradient chip 1 comprises a top outer substrate 12, a bottom outer substrate 13 and an intermediate substrate 14. These substrates 12, 13, 14 are glued together. The gradient chip 1 has a slot 15, which is roughly T-shaped in cross-section, with the T turned down in FIG. 7.

The side parts of the "T" form guide grooves 16a, 16b for the sample chip 2, which exactly fits within the guide grooves 16a, 16b. The central part of the "T" forms a sample groove 17, large enough to house the sample well 22 located on the sample chip 2 upon insertion, compare arrow 71 for the direction of insertion.

Within the sample well 22, there is the RF coil 21. RF coil 21 is connected to a coupling coil 72 also micromachined onto the sample chip 2. A capacitor 73 is mounted onto the sample chip 2 for the purpose of tuning the resonance frequency of RF coil 21 at the NMR frequency of interest. Note that the tuning capacitor 73 can also be directly micromachined onto the sample chip 2. On top and on the bottom of the gradient chip 1, there is the gradient coil system, but only one partial gradient coil 10a is shown in FIG. 7 for simplification.

The typical thickness $d_{gc}$ of a gradient chip 1 in x direction is about 1.5-3.0 mm. The typical thickness $d_{sc}$ of the sample chip 2 in the substrate area is about 0.5-1.0 mm. The typical height of the sample well 22 in x direction is about 0.3-0.5 mm, and its diameter is typically at about 3-5 mm.

Figure 8:
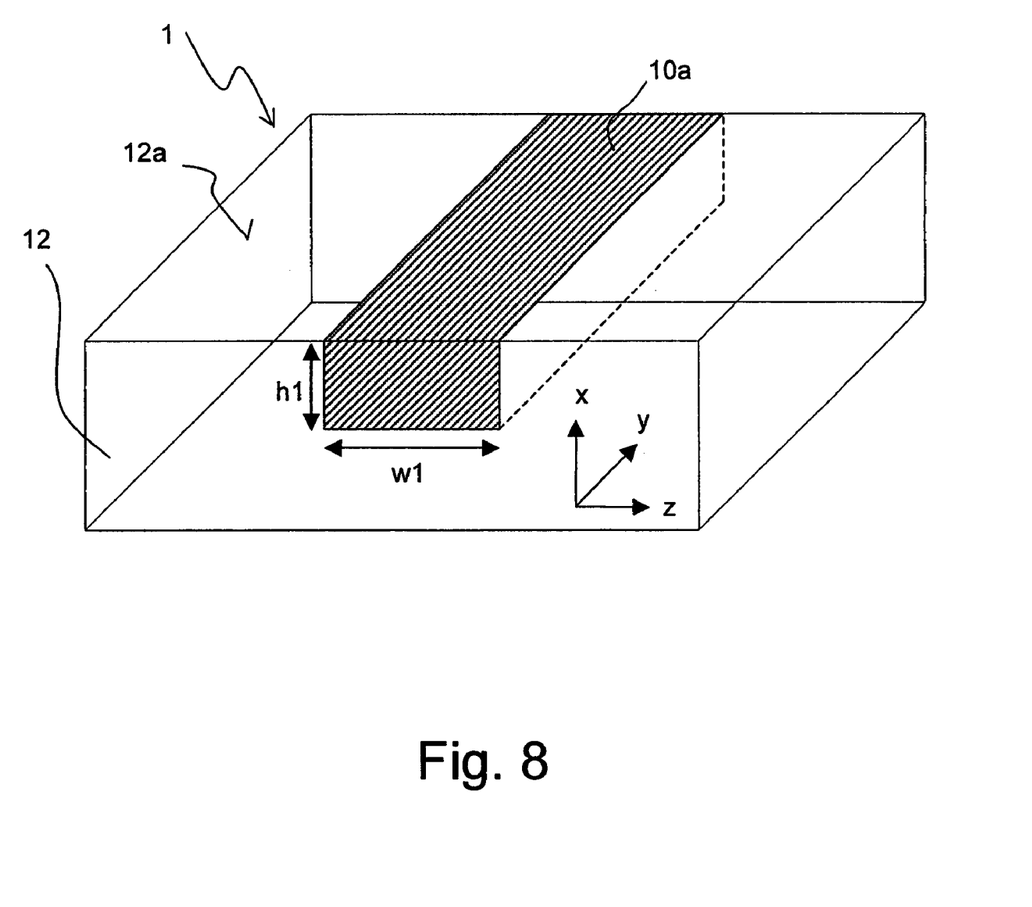
FIG. 8 shows a schematic cut-out view of the top substrate of a gradient chip of an inventive NMR probe component, with a gradient coil wire deposited within an etched groove.

FIG. 8 shows a cut-out view of the top substrate 12 of a gradient chip 1 of an inventive NMR probe component. The outer surface 12a of the gradient chip 1 has etched grooves receiving part of the gradient coils 10a-10c. As an example, a conducting section of a gradient coil 10a deposited within the etched groove is illustrated. The conducting section may have a height h1 of e.g. 20 μm up to 100 μm and a width w1 of, e.g., 50 μm up to 200 μm, and is preferably made of copper.

Figure 9:
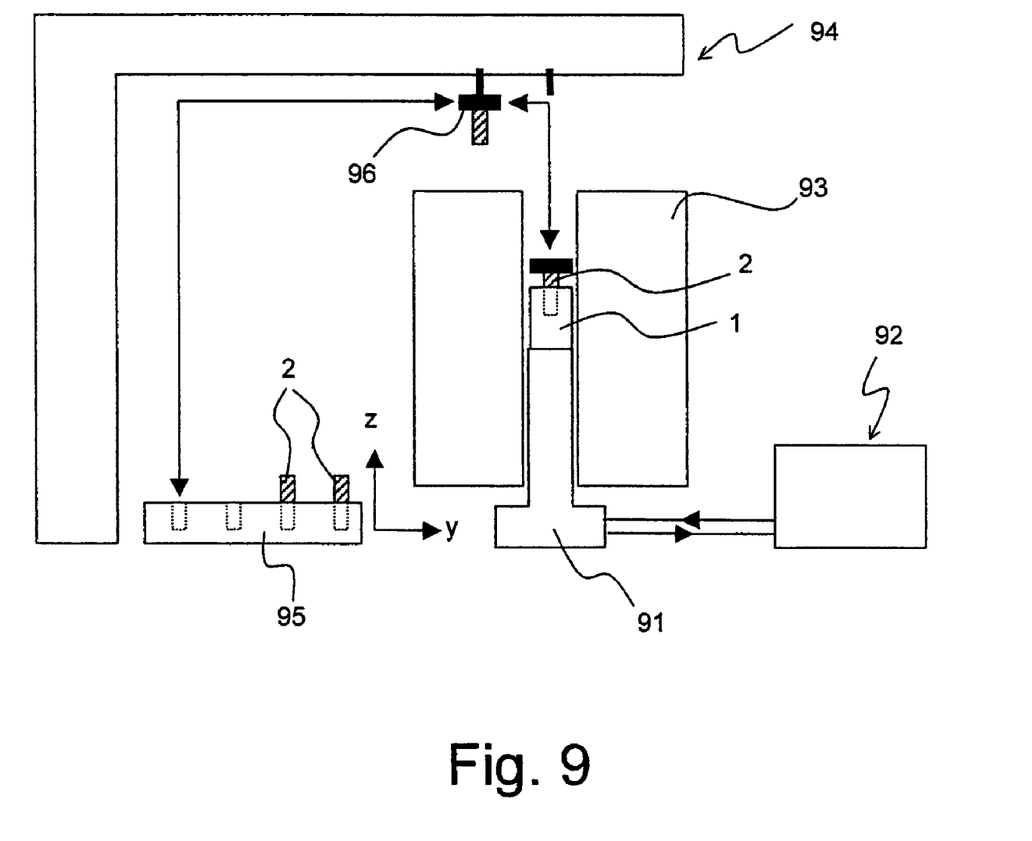
FIG. 9 shows schematically an NMR spectrometer with an automated sample chip handling system, feeding sample chips to a probe head comprising an inventive NMR probe component.

FIG. 9 shows schematically an inventive NMR spectrometer 92 with an automated sample chip handling system 94, feeding sample chips 2 to a probe head 91 comprising an inventive NMR probe component. Several sample chips 2 to be measured are stored in a chip holder 95 and are transported into the bore of a super-conducting magnet 93, then inserted into the gradient chip 1, by means of the automated sample chip handling system 94. The automated sample chip handling system 94 here comprises a gripper 96 that may be moved in y and z direction on guiding rails in a motor-operated and electronically controlled fashion.

We claim:

1. A nuclear magnetic resonance (NMR) probe component, comprising:

a microfabricated planar gradient chip having a substrate thickness $d_{gc} \leq 3$ mm and carrying three micromachined planar partial gradient coils on each of two outer surfaces thereof, wherein said partial gradient coils form a three-dimensional gradient system, said gradient chip having a central guiding and positioning slot between said two outer surfaces; and a sample chip for carrying an NMR sample at a sample location, said sample chip having a microfabricated planar RF coil, said sample chip fitting exactly in said guiding and positioning slot such that, in a measurement position, a sample location coincides with a center of said gradient system.

2. The NMR probe component of claim 1, wherein said gradient chip consists at least partially of a material having a thermal conductivity $\geq 75$ W/(mK) or said gradient chip consists at least partially of silicon.

3. The NMR probe component of claim 1, wherein said gradient chip comprises two outer substrates and an intermediate substrate.

4. The NMR probe component of claim 3, wherein said two outer substrates consist essentially of silicon and said intermediate substrate consists essentially of glass.

5. The NMR probe component of claim 1, wherein said slot comprises two opposing guide grooves abutting said sample chip at three side faces when said sample chip is within said slot, wherein said slot has a sample groove, facing the sample location of said sample chip and surrounding said sample chip when said sample chip is within said slot.

6. The NMR probe component of claim 1, wherein said slot is substantially T-shaped in a cross-section perpendicular to a direction of insertion of said sample chip.

7. The NMR probe component of claim 1, wherein said gradient system is adapted to produce a magnetic field gradient $\geq 10$ T/m or $\geq 50$ T/m.

8. The NMR probe component of claim 1, wherein said sample chip comprises coupling means for inductive or capacitive coupling to a probe.

9. The NMR probe component of claim 8, wherein said coupling means comprises a micromachined planar coupling coil, separated from said RF coil.

10. The NMR probe component of claim 1, wherein outer surfaces of said gradient chip have etched grooves receiving part of said gradient coils, wherein conducting sections of said gradient coils are deposited within said etched grooves.

11. The NMR probe component of claim 1, wherein said sample chip has a sample well.

12. An NMR spectrometer having an automated sample chip handling system for feeding sample chips to a probe head, the spectrometer comprising the NMR spectrometer probe component of claim 1.

13. The NMR spectrometer of claim 12, wherein the sample chip handling system comprises pneumatic transport means for moving the sample chips using pressurized gas, air, N2, or a noble gas.

14. The NMR spectrometer of claim 12, wherein the NMR spectrometer is structured for magnetic resonance imaging (MRI) of samples $\leqq 1$ mm.

* * * * *